April 27, 1943. D. E. NORGAARD Re. 22,306
WIDE BAND AMPLIFIER
Original Filed May 1, 1941
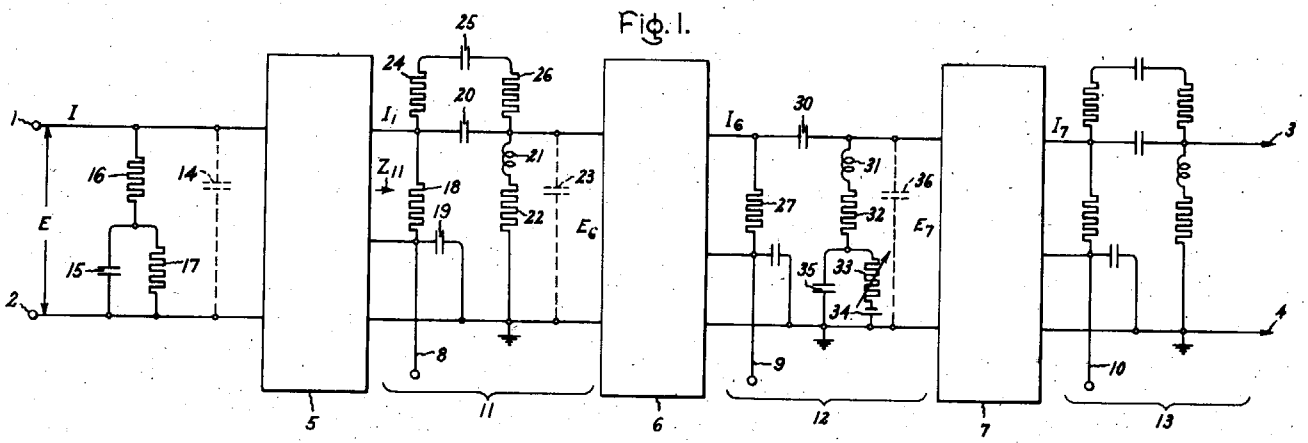
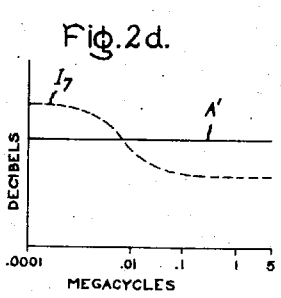
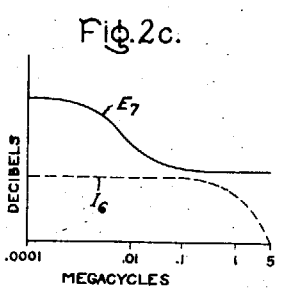
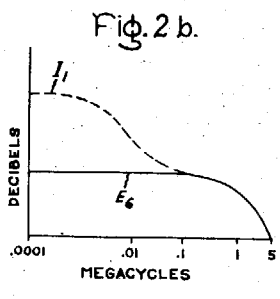
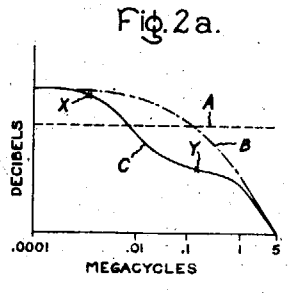
Inventor:
Donald E. Norgaard,
by Harry E. Denham
His Attorney.

Reissued Apr. 27, 1943

Re. 22,306

UNITED STATES PATENT OFFICE 22,306

WIDE BAND AMPLIFIER

Donald E. Norgaard, Schenectady, N. Y., assignor to General Electric Company, a corporation of New York Original No. 2,280,532, dated April 21, 1942, Serial No. 391,378, May 1, 1941. Application for reissue February 27, 1943, Serial No. 477,413

16 Claims. (Cl. 179—171)

My invention relates to wide band amplifiers such as those employed for the amplification of video frequency currents used in television.

It has for one of its objects to provide a method and means for producing uniform amplification at all frequencies of such currents from a level only slightly in excess of the undesired disturbing, or noise, currents to substantially higher level notwithstanding the attenuating effects of such shunt capacities as are usually present.

In television transmitters, camera tubes are employed which are exposed to the scene to be televised and which produce currents representing such scene. These discharge devices have very high impedance such that the currents flowing therefrom are not materially affected by the load impedance into which the tubes operate. These currents may have frequencies extending over the range from zero to about five megacycles. An object of my invention is to provide improved means for producing uniform amplification for these currents throughout this frequency range.

It so happens, in the use of the camera tube, that the currents produced thereby most faithfully represent the televised scene if adjusted to be as small as possible; i. e., the smaller the currents the better they represent the televised picture. Accordingly, one normally adjusts the electron beam of the camera tube to as low intensity as possible and still produce amplifiable output currents. Of course, the undesired disturbing, or, so called, noise, currents produced in the amplifier chain define the lower limit, it being necessary that the camera tube output currents be of intensity such that when amplified in the amplifier chain they have an intensity level sufficiently above the undesired noise level. These undesired currents extend throughout the frequency band to be transmitted but the most objectionable of them are in the frequency range below two thousand cycles, or substantially below the line repetition rate employed in the scanning process.

Difficulty is encountered in effecting uniform amplification over the band of frequencies to be amplified because of the low level of the desired signal with respect to the noise level and because of the attenuating effects of shunt capacity inherently present throughout the amplifier.

An object of my invention is to overcome this difficulty and secure uniform amplification throughout the band while minimizing the effects of disturbing currents introduced by the amplifier.

The novel features which I believe to be characteristic of my invention are set forth with particularity in the appended claims. My invention itself, however, both as to its organization and method of operation, together with further objects and advantages thereof, may best be understood by reference to the following description taken in connection with the accompanying drawing, in which Fig. 1 represents an embodiment of my invention, and Fig. 2*a*, Fig. 2*b*, Fig. 2*c* and Fig. 2*d* represent certain characteristics pertaining to its operation.

Referring to Fig. 1 of the drawing, I have shown therein an amplification channel extending from terminals 1, 2 to terminals 3, 4. The terminals 1, 2 may, of course, be connected to the output terminals of a cathode ray, or camera, tube used in picking up the scene to be televised and these terminals are connected to the input electrodes of an amplifier represented by the rectangle 5.

Fig. 1 includes three rectangles 5, 6 and 7, each of which may be taken to represent either a single stage electron discharge amplifier or a multistage amplifier but in the usual case these rectangles represent a multi-stage amplifier. Preferably the last stage in each of these amplifiers is of the pentode type, such that it has extremely high internal output impedance and produces output current which is independent of the magnitude of the load impedance.

The terminal 1 may be considered to be connected to the input grid of such an amplifier and the terminal 2 to the cathode through such bias means as may be employed. Operating potential for the anodes of the discharge devices represented by the rectangles 5, 6, and 7 may be supplied through conductors 8, 9, and 10 respectively to the respective anodes of the different discharge devices.

The network 11 between rectangles 5 and 6 is the interstage coupling network connected between the anode and the cathode of the last discharge device represented by rectangle 5 and the grid and cathode of the first discharge device represented by rectangle 6. Similarly, the network 12 between rectangles 6 and 7 represents the coupling network connected between the anode and cathode of the last discharge device represented by rectangle 6 and the grid and cathode of the first discharge device represented by rectangle 7. The output network 13 may be connected from the anode and cathode of the last discharge device represented by the rectangle 7 to the input of any additional stages of amplification that may be required.

As previously stated, the camera tube is one having extremely high impedance and thus the current produced thereby is not materially affected by the load impedance into which the tube operates. This current, we may consider to be represented by the dotted line A of Fig. 2*a* and it is desired that this current be amplified with uniform amplification over the frequency band to produce a voltage at the output terminals 3 and 4, which voltage may likewise be represented by a straight line, as indicated by the curve A' of Fig. 2*d*.

This current flows through the impedance between terminals 1 and 2. This impedance is made up of the input capacitance of the first discharge device represented by rectangle 5 which capacitance is indicated by dotted lines at 14, in shunt with such impedances as are present across the circuit, including, for example, resistance such as that indicated at 16 and 17 through which bias voltage may be supplied to the grid of the first stage of the amplifier 5. Such resistance is necessary to produce a limiting finite impedance at low frequencies across the input to the first discharge device of amplifier 5. The voltage across these terminals produced by the camera tube may, by reason of these impedances, vary with frequency as indicated, for example, by the curve B of Fig. 2*a*.

This voltage is as minute as it is practicable to make it and still be amplifiable in the presence of the noise level of the amplifier, the most objectionable of the noise currents introduced by the amplifier being at low frequency, below the line repetition rate, or below two thousand cycles.

Of course, one way to correct for the attenuation at high frequency, represented by the curve B is to connect across the circuit, a series combination of inductance and resistance proportioned with respect to capacity 14 to produce uniform impedance at all frequencies to be amplified. This, however, is not feasible because such inductance and resistance would have such low values that they would so reduce the input voltage available for amplification at all frequencies in the band that amplification thereof, in the presence of the undesired noise current introduced by the amplifier would be extremely difficult, and, in fact, out of the question.

In accordance with my invention, no attempt is made, in this part of the circuit, to effect the desired compensation. Instead, a condenser 15 is employed connected between the terminal 2 and a point between the two resistors 16 and 17, this condenser being so proportioned relative to resistances 16 and 17 as to produce substantial reduction in impedance at the intermediate frequencies without materially affecting the impedance at either the low frequencies or the high frequencies. Thus, the voltage across capacitance 14 may now, by reason of the presence of condenser 15, be represented by the curve C of Fig. 2*a*. The attenuation, equal to the difference between curves B and C, may be effected while still maintaining the signal intensity above the noise level at all frequencies.

It will be seen that curve C of Fig. 2*a* lies below curve B to a substantial extent only in the intermediate part of the range. At the extreme right end of the curve, corresponding to frequencies between about one megacycle and five megacycles, where condenser 15 has substantially zero reactance, the two curves substantially coincide. In this range of frequencies the shape of both curves is determined primarily by the capacitance 14, the reactance of which at these frequencies is low relative to the resistance of resistor 16. In this range of frequencies current flowing between terminals 1 and 2 flows largely through capacitance 14.

At frequencies below one megacycle the reactance of condensers 14 and 15 both increase but since the reactance of capacitance 14 is much greater than that of condenser 15 it becomes very high relative to resistance 16 while the reactance of condenser 15 remains negligible with respect to resistance 16. This is true at about one hundred and fifty thousand cycles. Since the reactance of condenser 14, at the frequency corresponding to the point Y of curve C, is already large relative to resistance 16, it, at this and lower frequencies, has little or no effect upon the shape of the curve C. Similarly, since the reactance of condenser 15 is negligible at the frequency corresponding to the point Y, it has little effect upon the shape of the curve C at that point Y. The shape of the curve at this point Y is determined by the resistance 16 and, therefore, curve C in the region of point Y is substantially a straight line nearly parallel to the horizontal, or frequency, axis of the graph.

At frequencies below the point Y, the reactance of condenser 15 increases and first becomes high relative to resistance 16 and finally becomes high as compared with resistance 17, which is about ten times greater than resistance 16. Thus, the voltage between terminals 1 and 2 rises with reduced frequency until the point X is reached where the reactance of condenser 15 is so high that it no longer is effective in determining the shape of the curve. Below this point X, curves B and C coincide.

While the use of condenser 15 results in a loss of signal input over a region of intermediate frequencies, it does not reduce the signal input at low frequencies where the noise level is highest. It produces the important advantage of dividing the signal frequency band in two distinct portions each having distinctly different signal levels and which may be treated separately. Both portions may now be amplified until the lower frequency portion which is of higher intensity, becomes of such amplitude that further amplification with a given tube complement results in distortion due to overloading. The lower frequency band may then be attenuated to produce uniform amplification over the entire lower frequency portion of the band without loss in amplification in the higher frequency portion of the band, without changing the characteristic relation between voltage and frequency in the high frequency portion of the band, and without reducing the signal level to a point objectionably close to the noise level at low frequencies.

Now the entire band may be amplified to such a level that circuits may be employed to increase the intensities of currents of the highest frequencies in the band to a level of the low frequency currents. Such circuits are of such character, as will presently be explained, that they produce a loss at all frequencies and especially the low frequencies. However, by reason of my invention, such circuits may be employed after sufficient amplification has been had that this loss may be tolerated without reducing the signal to a level too close to the noise level of the amplifier.

The voltage represented by the curve C is amplified by the amplifier 5 and produces a current represented by the curve $I_1$ of Fig. 2b at the output of the amplifier 5. This curve $I_1$ has the same shape as the curve C of Fig. 2a since the amplifier 5 has uniform amplification at all frequencies involved and its last stage has high internal impedance to currents in its output circuit as previously mentioned.

This current is supplied by amplifier 5 to the network 11 coupling that amplifier to the amplifier 6. A portion of this current flows through resistance 18 and by-pass condenser 19. The voltage on the resistance 18 is supplied through coupling condenser 20 to the grid of the first discharge device of the amplifier 6. Between the grid and cathode of this discharge device is connected the series combination of inductance 21 and resistance 22, which are proportioned relative to the shunt capacitance 23, effective across the input of the amplifier 6 to have uniform impedance throughout the band to electromotive force existing across the combination 21, 22, and 23.

Connected across condenser 20 is a path comprising resistance 24, condenser 25, and resistance 26, the elements 18, 20, 24, 25, 26, 21 and 22 being proportioned relative to resistances 16 and 17 and capacitance 15 to attenuate the low frequency currents in the band, thereby to produce voltage across capacitance 23, which voltage may be represented by the curve $E_6$ of Fig. 2b.

This is effected by so proportioning the elements that the sum of resistances 18 and 22 bears the same ratio to resistance 16 that the sum of resistances 24 and 26 bears to resistance 17, and that the capacitance of condenser 15 bears to the capacitance of condenser 20.

In the path 24, 25, and 26, the resistances 24 and 26 are of equal value and the condenser 25 is of negligible reactance as compared with the sum of resistances 24 and 26 at the lowest frequency to be amplified; for example, ten cycles per second. In other words, the path 24, 25, 26 is essentially purely resistive throughout the band. Resistances 24 and 25 are so large that capacity between condenser 25 and ground does not materially affect the transmission characteristics of the channel.

Such proportioning of the elements not only produces uniform amplification over the band including frequencies up to 150,000 cycles, but it also renders the system as will later be shown, independent of frequency so that no undesired phase shifts at the different frequencies are produced.

This network produces attenuation at the lower frequencies to bring about the uniform amplification desired. This attenuation occurs, however, after the amplification of amplifier 5 has been had so that the voltage $E_6$ is still above the noise level of amplifier 6 even at low frequencies where the disturbing currents are the most intense.

Having produced uniform amplification over the low frequency portion of the band; i. e., up to 150,000 cycles, it now remains to accentuate the high frequencies sufficiently to produce uniform amplification over the entire band. The band over which accentuation is to be effected and the magnitude of accentuation required are now much less than would be the case if all of the compensation were to be effected in a single stage of the amplifier.

The voltage represented by the curve $E_6$ is amplified by amplifier 6 in the presence, of course, of such noise currents as are produced by amplifier 6. This amplifier supplies to the network 12 an output current which is represented by the curve $I_6$ of Fig. 2c. The signal voltage on resistance 27 is supplied through coupling condenser 30 to the input of the first discharge device of amplifier 7 between the grid and cathode of which is connected a network comprising an inductance 31, resistance 32, resistance 33 and bias battery 34, a condenser 35 being connected between ground and a point between resistances 32 and 33. The resistance 33 may be variable, if desired, to correct for changing internal resistance in the source 34 which may be a battery.

Resistor 27, which comprises a portion of the network 12 is connected in the path through which unidirectional anode current to the last stage of amplifier 6 is supplied, and has, therefore, a high resistance. Only a small fraction of the signal current output of the amplifier 6 flows through this resistor, the remainder of the output current flowing through condenser 30 and the series parallel combination represented by elements 31, 32, 33, 34, 35 and 36. That is, the impedance looking to the right of the juncture of resistance 27 and condenser 30 is considerably lower than the resistance 27 over the entire range of frequencies involved. Condenser 30 serves as a blocking condenser to prevent application of unidirectional anode voltage to the grid of the first stage of amplifier 7. This condenser must have a reactance substantially lower than the resistance 27 at the lowest frequency considered, i. e., ten cycles per second, so that the impedance into which amplifier 6 works is determined principally by elements 30, 31, 32, 33, 34, 35 and 36 of the network 12.

Since, as has been shown earlier, the extreme right end of the curves C, $E_6$ and $I_6$ is affected by the condenser 14, acting together with resistor 16, the impedance elements 31 and 32 are proportioned in such a manner that the time constant of the series combination of elements 31 and 32 is the same as the time constant of the parallel combination of elements 14 and 16 in order to effect compensation for the phase and amplitude of the currents and voltages in the upper range of frequencies.

It is important that the frequency at which the network 12 resonates be not lower than 2 to 3 times the upper limit of the amplifier system; i. e., from 10 to 15 megacycles in the embodiment shown, in order that the resonance effect shall not affect transmission in the band. This resonance is produced primarily by inductance 31 and capacitance 36. Since stray capacity 36 cannot be reduced appreciably, it is necessary that inductance 31 be chosen to resonate with the capacity 36 at a frequency well outside of the pass-band of the amplifier. Thus, the resistance 32 and the inductance 31, in general, have exceptionally low values when the circuit is adjusted to give nearly exact compensation. For example, the resistance 32 may be ten ohms and the inductance 31 three microhenries.

By so proportioning these elements, uniform amplification over the entire band up to the input of amplifier 7 may be had. It so happens, however, that since the value of resistance 32 and inductance 31 required to produce such uniform amplification are very small, they reduce the intensity of the signal over the entire band. However, at this point of the circuit, the previous amplification has been sufficient that this loss can be tolerated without reducing the signal level to a point insufficiently above the noise level of amplifier 7.

If, in a particular installation, the signals are reduced to a point insufficiently above the noise level of amplifier 7 then resistance 33 and condenser 35 may be included in the circuit and proportioned relative to resistance 32 in the same way that resistance 17 and condenser 15 are proportioned relative to resistance 16 thereby to increase the impedance at low frequencies to produce a voltage across capacitance 36 varying with frequency in the manner illustrated by curve $E_7$ of Fig 2c. Condenser 35 is a substantial short circuit to resistance 33 at the high frequencies to be accentuated but is of sufficiently high reactance at the low frequencies where noise currents are most objectionable to render resistance 33 effective in series with resistance 32 to increase the impedance across the channel and bring about the increased low frequency amplification evidenced by the left end of curve $E_7$.

This voltage $E_7$ is amplified by amplifier 7, which produces a current in its output which may be represented by the curve $I_7$ of Fig. 2d. This current is supplied to the network 13 which is identical in its action to network 11. That is, it reduces the low frequency voltage supplied to the terminals 3 and 4 relative to the high frequency voltage thereby producing transformation between current at the terminals 1 and 2 and voltage at the terminals 3 and 4 which is uniform at all frequencies in the band of frequencies to be transmitted. This voltage at terminals 3 and 4 is represented by the curve A' of Fig. 2d and may be of an intensity of the order of half a volt, well above noise level at all frequencies, and such that it may be readily amplified to any desired intensity required for the transmittion of the picture represented thereby by modulation upon a carrier wave to be transmitted by radio.

It will thus be seen that an important feature of my invention resides in the use of the network 15, 16, 17 at the input to amplifier 5. This network, in effect, divides the frequency band into two portions, the low frequency portion below the frequency represented by point Y of Fig. 2a and the high frequency portion above the frequency represented by this point Y. This permits these two portions to be treated separately in the respective networks 11 and 12, the network 11 producing uniform amplification over the low frequency portion of the band with an output intensity above the noise level of amplifier 6 and the network 12 accentuating voltages in the high frequency portion of the band. Since, however, the elements required to accentuate the high frequency currents may reduce the intensity of the low frequency currents to intensities unsatisfactorily small, the elements 35 and 33 may be included to maintain the lows sufficiently above the noise level of amplifier 7. Network 13 then brings about the uniform amplification over the band.

I have now generally set forth the character of my invention. For a more detailed consideration let us first consider the amplifier 5 and the networks between which it operates, and the portion of the band of frequencies below the point Y of Fig. 2a. This point is at a frequency below the frequencies the transmission of which is affected by capacitance 14 and above the frequencies the transmission of which is affected by condenser 15.

Since the network 11 compensates for the variation in transmission with frequency caused by elements 15, 16, 17, it, of course, is designed relative to that network.

The voltage between terminals 1 and 2 may be expressed by the following equation:

$$E=I\left[R_{16}-\frac{j\frac{R_{17}}{\omega C_{15}}}{R_{17}-\frac{j}{\omega C_{15}}}\right] \qquad (1)$$

where I represents the current supplied to the input through terminals 1 and 2; E represents the voltage between terminals 1 and 2; R and C represent, respectively, the resistance and capacity of the elements of Fig. 1 designated by the reference numeral written as a subscript after the respective character; $\omega$ represents frequency multiplied by the constant $2\pi$ where $\pi=3.1416$; and $j$ represents the imaginary quantity, $\sqrt{-1}$.

This nomenclature will be employed throughout the following.

Equation 1 is true only for frequencies below the point Y of Fig. 2a; i. e., below around 150,000 cycles.

If G represents the overall mutual conductance of amplifier 5 then the current $I_1$ at the output of amplifier 5 may be expressed by the following equation:

$$I_1=GE \qquad (2)$$

Now, neglecting the capacitance $C_{23}$ and letting $L_{21}$; i. e., the reactance of inductance 21, equal zero, the impedance $Z_{11}$ of network 11 as viewed from amplifier 5 may be expressed as follows:

$$Z_{11}=\frac{\left[R_{22}-\frac{\frac{j[R_{24}+R_{26}]}{\omega C_{20}}}{R_{24}+R_{26}-\frac{j}{\omega C_{20}}}\right]R_{18}}{R_{22}+R_{18}-\left[\frac{\frac{j[R_{24}+R_{26}]}{\omega C_{20}}}{R_{24}+R_{26}-\frac{j}{\omega C_{20}}}\right]} \qquad (3)$$

This equation is true at frequencies at which the reactance of condenser 25 is negligible with respect to the sum, $R_{24}+R_{26}$.

The voltage $E_6$ at the input to amplifier 6 may be expressed as follows:

$$E_6=\left[\frac{R_{22}}{R_{22}-\left[\frac{\frac{j[R_{24}+R_{26}]}{\omega C_{20}}}{R_{24}+R_{26}-\frac{j}{\omega C_{20}}}\right]}\right]I_1Z_{11}$$

Substituting from Equation 2 for $I_1$ and from Equation 3 for $Z_{11}$:

$$E_6=\left[\frac{R_{22}}{R_{22}-\left[\frac{\frac{j[R_{24}+R_{26}]}{\omega C_{20}}}{R_{24}+R_{26}-\frac{j}{\omega C_{20}}}\right]}\right]GE\left[\frac{\left[R_{22}-\frac{\frac{j[R_{24}+R_{26}]}{\omega C_{20}}}{R_{24}+R_{26}-\frac{j}{\omega C_{20}}}\right]R_{18}}{R_{22}+R_{18}-\left[\frac{\frac{j[R_{24}+R_{26}]}{\omega C_{20}}}{R_{24}+R_{26}-\frac{j}{\omega C_{20}}}\right]}\right]$$

Simplifying and substituting from Equation 1 for E:

$$E_6=\frac{R_{22}R_{18}GI\left[R_{16}-\dfrac{\dfrac{jR_{17}}{\omega C_{15}}}{R_{17}-\dfrac{j}{\omega C_{15}}}\right]}{R_{22}+R_{18}-\left[\dfrac{\dfrac{j[R_{24}+R_{26}]}{\omega C_{20}}}{R_{24}+R_{26}-\dfrac{j}{\omega C_{20}}}\right]} \qquad (4)$$

If $R_{22}+R_{18}=aR_{16}$, where $a$ is a real constant; $R_{24}+R_{26}=aR_{17}$ and $C_{15}=aC_{20}$, then from Equation 4 the following is obtained:

$$E_6=\frac{GR_{18}R_{22}I\left[\dfrac{R_{22}+R_{18}}{a}-j\dfrac{\dfrac{R_{24}+R_{26}}{\omega a^2C_{20}}}{\dfrac{R_{24}+R_{26}}{a}-\dfrac{j}{\omega aC_{20}}}\right]}{R_{22}+R_{18}-j\left[\dfrac{\dfrac{R_{24}+R_{26}}{\omega C_{20}}}{[R_{24}+R_{26}]-\dfrac{j}{\omega C_{20}}}\right]}$$

Simplifying, $$E_6=\frac{GR_{18}R_{22}I}{a} \qquad (5)$$

Thus, it is found that $E_6$, the input voltage of amplifier 6, is independent of frequency below the frequency Y if the above proportionalities be made. Moreover, all of the quantities in Equation 5 are real quantities, which means that there is no phase shift between the current I supplied at terminals 1 and 2 and the voltage $E_6$ supplied to amplifier 6 over the frequency range below the point Y.

This voltage $E_6$ is now amplified by amplifier 6 and produces current $I_6$ in network 12 where compensation for the effect of capacitance 14 at high frequencies is made.

Now, considering frequencies higher than that corresponding to point Y, it is necessary, as previously stated, that the time constant of the elements 31 and 32 equal that of the elements 16 and 14 or that $$\frac{L_{31}}{R_{32}}=R_{16}C_{14}$$

The series circuit comprising inductance 31 and resistance 32, having the same time constant as the shunt circuit comprising capacitance 14 and resistance 16, produces exactly equal and opposite effects upon the transmission through the system, and thus, except for the effect of elements 35 and 33 at low frequencies, uniform amplification over the entire band, exists between the terminals 1 and 2 and the input to amplifier 7.

Elements 35 and 33 may be necessary, however, in order that the signal voltage be large enough at the low frequencies to override the low frequency noise level of the amplifier 7. In that case after the signals have been transmitted through the amplifier 7, the low frequencies may be attenuated sufficiently to match the high frequencies as indicated by curve A′ of Fig. 2*d* and thus produce uniform amplification over the band up to the output terminals and signal intensity at the output well above the noise level of any subsequent amplifiers.

While in this specification and claims I have referred to wide band amplifiers and have particularly mentioned the frequency band extending from ten cycles to four or five megacycles, it will, of course, be understood that my invention is readily applicable to amplifiers operating over much narrower bands of frequencies. My invention finds utility in any amplifier where the signal level to be amplified and the frequency range over which the amplifier must operate are such that the attenuating effects of shunt capacitance cannot be compensated in a single network of the amplifier without undesirably reducing the signal level.

While I have shown a particular embodiment of my invention, it will, of course, be understood that I do not wish to be limited thereto since different modifications both in the circuit arrangement and in the instrumentalities employed may be made, and I contemplate by the appended claims to cover any such modifications as fall within the true spirit and scope of my invention.

What I claim as new and desire to secure by Letters Patent of the United States is:

1. In an amplifier for producing uniform ratio between input current and output voltage, said amplifier having resistance and capacity in shunt with its input to which said current is supplied said current having frequencies extending over a wide band and having intensities only slightly above the noise level of said amplifier, the method which comprises attenuating currents in the intermediate frequency portion of said band above the frequency of the most intense noise currents of the amplifier without changing the characteristic relation between intensity of voltage on said resistance and capacity and frequency in the high frequency portion of the band, attenuating in a later stage of the amplifier low frequency currents to produce uniform amplification at all frequencies below said high frequency portion of the band and thereafter accentuating the voltages having frequencies in said high frequency portion of the band by an amount sufficient to overcome the attenuation produced by said shunt resistance and capacity in said high frequency portion of the band, said accentuation occurring at a point of said amplifier subsequent to a stage following the point where said low frequency accentuation occurs thereby to avoid overloading said last mentioned stage with currents to be attenuated.

2. In an amplifier for producing uniform ratio between input current and output voltage, said amplifier having resistance and capacity in shunt with its input to which said current is supplied, said current having frequencies extending over a wide band, the method which comprises attenuating currents in the intermediate frequency portion of said band above the frequency of the most intense noise currents of the amplifier without changing the characteristic relation between intensity of voltage on said resistance and capacity and frequency in the high frequency portion of the band, amplifying the entire band, reducing the voltages having frequencies below said high frequency portion of the band to uniform intensity, again amplifying the entire band, and thereafter accentuating the voltages in the high frequency portion of said band sufficiently to overcome the effect of said shunt resistance and capacity in said high frequency portion of the band.

3. The combination, in an amplifier for electromotive forces existing across a capacitance at the input to said amplifier, said electromotive force having frequencies extending over a wide band and having intensity at low frequencies only slightly above the level of undesired low frequency currents, of a resistance across said capacity, a portion of said resistance being shunted by a second capacity, said portion and said second capacity being proportioned to reduce voltage across said first capacity above said low frequencies without affecting the characteristic relation between said voltage and frequency at high frequencies, means between stages of the amplifier to produce uniform amplification at all frequencies below said high frequencies while maintaining the voltage above the noise level and means between later stages of said amplifier to accentuate the high frequencies to produce uniform amplification at said frequencies.

4. The combination, in a multistage amplifier, a circuit at the input to one of the stages of said amplifier having shunt resistance and capacity producing attenuation of high frequency currents in the band to be amplified, a circuit between stages in said amplifier having shunt resistance and capacity, an inductance in series with said last resistance, said inductance and said resistance having a time constant equal to the time constant of said first mentioned shunt resistance and capacity, a shunt combination of resistance and capacitance in series with said second mentioned shunt resistance proportioned to reduce the attenuation caused by said inductance and the resistance in series with it of low frequency currents thereby to maintain the electromotive forces at said low frequencies above the noise level of the stage of said amplifier subsequent thereto.

5. The combination, in a multistage amplifier, a circuit at the input to one of the stages of said amplifier having shunt resistance and capacity producing attenuation of high frequency currents in the band to be amplified, a circuit between stages in said amplifier having shunt resistance and capacity, an inductance in series with said last resistance, said inductance and said resistance having a time constant equal to the time constant of said first mentioned shunt resistance and capacity, a shunt combination of resistance and capacitance in series with said second mentioned shunt resistance proportioned to reduce the attenuation produced by said inductance and the resistance in series with it of low frequency currents thereby to maintain the electromotive forces at said low frequencies above the noise level of the stage of said amplifier subsequent thereto, and means later in said amplifier to attenuate the low frequency currents to a level of the high frequency currents.

6. The combination, in an amplification channel for currents having frequencies extending over a wide band, the high frequency currents in said band being attenuated by the effect of capacity and resistance in shunt to said channel, of an amplifier having an output circuit having impedance at said high frequencies determined by an inductance and resistance in series across said channel and shunted by a capacity, said inductance and capacity resonating above the band of frequencies to be amplified and said inductance and resistance having a time constant equal to the time constant of said first mentioned resistance and capacity producing said attenuation, but having values so low as to produce undesired attenuation at low frequencies and a shunt combination of resistance and capacity in series with said inductance and resistance, said combination having sufficient impedance at low frequencies to prevent said undesired attenuation and sufficiently low impedance at high frequencies as not materially to effect the transmission of high frequency currents.

7. In combination, an amplifier channel having shunt resistance and capacity to which current to be amplified is supplied, said current having such intensities and frequencies extending over a band so wide that the attenuating effect of said resistance and capacity at high frequency cannot be compensated in a single stage of said amplifier without undesirably reducing the intensity level of electromotive force across said resistance and capacity, of means to produce a uniform application ratio over a band of frequencies intermediate in said first mentioned band, and means, thereafter, to compensate the variation in amplification of said amplifier with respect to frequency over the portion of said band below said intermediate portion, and a subsequent stage of said amplifier having means to compensate the variation in amplification over the portion of the band above said intermediate frequency portion, thereby to produce uniform amplification over the entire band.

8. The combination, in a wide band amplifier having resistance and capacity in shunt with the input thereof and additional capacity shunting a portion of said resistance, and having an interstage network comprising an interstage coupling capacity shunted by a second resistance and having shunt resistance at either side of said coupling capacity, said first resistance, said portion and said additional capacity being proportioned to accentuate low frequency current with respect to current of intermediate frequency in the band to be amplified, and said coupling capacity, second resistance and shunt resistances being proportioned relative to said additional capacity, said portion and first resistance to attenuate said low frequency currents to produce uniform amplification at all low frequencies.

9. The combination, in a wide band amplifier having resistance and capacity in shunt with the input thereof, and additional capacity shunting a portion of said resistance, and having an interstage network comprising a coupling capacity shunted by a second resistance and having shunt resistance at either side of said coupling capacity, the ratio of the sum of said shunt resistances to that part of said first resistance not shunted by said additional capacity being equal to the ratio of said second resistance to said portion of said first resistance, and these ratios both being equal to the ratio of said additional capacity to said coupling capacity.

10. The combination, in a wide band amplifier having resistance and capacity in shunt with the input thereof, and additional capacity shunting a portion of said resistance, and having an interstage network comprising an interstage coupling capacity shunted by a second resistance and having shunt resistance at either side of said coupling capacity, the ratio of the sum of said shunt resistances to that part of said first resistance not shunted by said additional capacity being equal to the ratio of said second resistance to said portion of said first resistance shunted by said additional capacity, and these ratios both being equal to the ratio of said additional capacity to said coupling capacity, and an amplifier subsequent to said network amplifying the currents of all frequencies in said band, said amplifier including means to accentuate the high frequency currents sufficiently to compensate for attenuation thereof produced by said first resistance and capacity thereby to produce uniform amplification over the entire band.

11. The method of amplifying currents having frequencies extending over a wide band in a multistage amplifier having input capacity undesirably attenuating high frequency currents in said band, which comprises the steps of first accentuating low frequency currents in the band relative to currents of intermediate frequency in said band, amplifying the entire band, attenuating said low frequency currents, again amplifying the entire band, accentuating low and high frequency currents relative to intermediate frequency currents, again amplifying the entire band and then attenuating said low frequency currents to produce uniform amplification at all frequencies in the band.

12. In a multistage amplifier for currents having frequencies extending over a wide band and having input capacity undesirably attenuating high frequency currents in said band, means in said input circuit to accentuate low frequency currents in said band to a level well above the low frequency noise level of the first stage of said amplifier, means to attenuate said low frequency currents in a part of said amplifier subsequent to said first stage sufficiently to permit amplification of the entire band in another stage of said amplifier without low frequency overloading of said other stage, means between said other stage and a third stage to accentuate both low and high frequency currents in said band relative to currents of intermediate frequency, and means in said amplifier subsequent to said third stage to attenuate said low frequency currents to the level of said high frequency currents thereby to produce uniform amplification over said band.

13. A wide band amplifier having resistance in shunt with the input thereof and capacity shunting a portion of said resistance, and having an interstage network comprising an interstage coupling capacity shunted by a second resistance and having shunt resistance at either side of said coupling capacity, said first resistance, said portion and said capacity shunting said portion being proportioned to accentuate current of low frequency within a predetermined band to be amplified with respect to current of high frequencies in said predetermined band, and said coupling capacity, second resistance and shunt resistances being proportioned relative to said capacity shunting said portion, said portion and said first resistance to attenuate said low frequency currents to produce uniform amplification at all frequencies in said predetermined band.

14. A wide band amplifier having resistance in shunt with the input thereof, and capacity shunting a portion of said resistance, and having an interstage network comprising a coupling capacity shunted by a second resistance and having shunt resistance at either side of said coupling capacity, the ratio of the sum of said shunt resistances to that part of said first resistance not shunted by said capacity being equal to the ratio of said second resistance to said portion of said first resistance, and these ratios both being equal to the ratio of said capacity shunting said portion to said coupling capacity.

15. In a wide band amplifier, an input network and an output network, one of said networks comprising a shunt resistance and a capacity shunting a portion of said resistance, the other of said networks comprising a coupling capacity shunted by a second resistance and having shunt resistances at either side of said coupling capacity, said first resistance, said portion and said capacity shunting said portion being proportioned to accentuate current of low frequency within a predetermined band to be amplified with respect to current of high frequencies in said predetermined band, and said coupling capacity, second resistance and shunt resistances being proportioned relative to said capacity shunting said portion, said portion and said first resistance to attenuate said low frequency currents to produce uniform amplification at all frequencies in said predetermined band.

16. In a wide band amplifier, an input network and an output network, one of said networks comprising a shunt resistance and a capacity shunting a portion of said resistance, the other of said networks comprising a coupling capacity shunted by a second resistance and having shunt resistances at either side of said coupling capacity, the ratio of the sum of said last mentioned shunt resistances to that part of said first resistance not shunted by said capacity being equal to the ratio of said second resistance to said portion of said first mentioned resistance, and these ratios both being equal to the ratio of said capacity shunting said portion to said coupling capacity.

DONALD E. NORGAARD.